United States Patent
Amano et al.

(10) Patent No.: US 9,653,706 B2
(45) Date of Patent: May 16, 2017

(54) ORGANIC ELECTROLUMINESCENT ELEMENT, LIGHTING DEVICE, LIGHTING SYSTEM, AND METHOD FOR MANUFACTURING ORGANIC ELECTROLUMINESCENT ELEMENT

(71) Applicant: Kabushiki Kaisha Toshiba, Minato-ku (JP)

(72) Inventors: Akio Amano, Machida (JP); Tomoaki Sawabe, Sumida (JP); Keiji Sugi, Fujisawa (JP); Daimotsu Kato, Fuchu (JP); Hayato Kakizoe, Kawasaki (JP); Tomio Ono, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/153,902

(22) Filed: May 13, 2016

(65) Prior Publication Data
US 2016/0254495 A1    Sep. 1, 2016

Related U.S. Application Data

(63) Continuation of application No. PCT/JP2013/080838, filed on Nov. 14, 2013.

(51) Int. Cl.
*H01L 51/00*      (2006.01)
*H01L 51/52*      (2006.01)
(Continued)

(52) U.S. Cl.
CPC ........ *H01L 51/5271* (2013.01); *H01L 27/326* (2013.01); *H01L 51/5218* (2013.01);
(Continued)

(58) Field of Classification Search
CPC . H01L 51/56; H01L 51/5271; H01L 51/5203; H01L 51/5209; H01L 51/5225; H01L 51/5234
(Continued)

(56) References Cited

U.S. PATENT DOCUMENTS

| | | | |
|---|---|---|---|
| 2004/0099305 | A1 | 5/2004 | Heller |
| 2006/0226429 | A1 | 10/2006 | Sigalas |

(Continued)

FOREIGN PATENT DOCUMENTS

| | | |
|---|---|---|
| JP | 9-306668 | 11/1997 |
| JP | 2006-294617 | 10/2006 |

(Continued)

OTHER PUBLICATIONS

International Search Report and Written Opinion issued Feb. 4, 2014 in PCT/JP2013/080838.

*Primary Examiner* — Thuy Vinh Tran
(74) *Attorney, Agent, or Firm* — Oblon, McClelland, Maier & Neustadt, L.L.P.

(57) ABSTRACT

According to one embodiment, an organic electroluminescent element includes a first electrode, an organic layer, and a second electrode. The first electrode is light-transmissive. The organic layer is provided on the first electrode. The second electrode is provided on the organic layer. The second electrode is light-reflective and includes a first conductive portion and a second conductive portion. The first conductive portion extends in a first direction. The second conductive portion extends in a second direction intersecting the first direction. The second conductive portion intersects the first conductive portion. A length in the first direction of the first conductive portion is longer than 1 mm and not more than 47 mm. A length in the second direction of the second conductive portion is longer than 1 mm and not more than 47 mm.

9 Claims, 13 Drawing Sheets

(51) Int. Cl.
*H01L 51/56* (2006.01)
*H05B 33/08* (2006.01)
*H01L 27/32* (2006.01)

(52) U.S. Cl.
CPC ...... *H01L 51/5221* (2013.01); *H01L 51/5225* (2013.01); *H01L 51/5228* (2013.01); *H01L 51/56* (2013.01); *H05B 33/0896* (2013.01)

(58) Field of Classification Search
USPC .................................................. 257/40, 103
See application file for complete search history.

(56) References Cited

U.S. PATENT DOCUMENTS

| | | |
|---|---|---|
| 2012/0299050 A1 | 11/2012 | Lifka et al. |
| 2013/0075762 A1 | 3/2013 | Nakamura et al. |
| 2013/0182418 A1* | 7/2013 | Sawabe ............... F21L 4/00 362/157 |
| 2013/0250214 A1* | 9/2013 | Sugi ................ H01L 51/5203 349/69 |
| 2013/0250557 A1 | 9/2013 | Sugizaki et al. |

FOREIGN PATENT DOCUMENTS

| | | |
|---|---|---|
| JP | 2007-48677 | 2/2007 |
| JP | 2007-224396 | 9/2007 |
| JP | 2011-129539 | 6/2011 |
| JP | 2012-59417 | 3/2012 |
| JP | 2012-227459 | 11/2012 |
| JP | 2012-243622 | 12/2012 |
| JP | 2013-68898 | 4/2013 |
| JP | 2013-513916 | 4/2013 |
| JP | 2013-149376 | 8/2013 |
| JP | 2013-161589 | 8/2013 |
| JP | 2013-200959 | 10/2013 |

* cited by examiner

ORGANIC ELECTROLUMINESCENT ELEMENT, LIGHTING DEVICE, LIGHTING SYSTEM, AND METHOD FOR MANUFACTURING ORGANIC ELECTROLUMINESCENT ELEMENT

CROSS-REFERENCE TO RELATED APPLICATIONS

This is a continuation application of International Application PCT/JP2013/080838, filed on Nov. 14, 2013; the entire contents of which are incorporated herein by reference.

FIELD

Embodiments described herein relate generally to an organic electroluminescent element, a lighting device, lighting system, and a method for manufacturing an organic electroluminescent element.

BACKGROUND

There is an organic electroluminescent element that includes a light-transmissive first electrode, a light-reflective second electrode, and an organic layer provided between the first electrode and the second electrode. There is a lighting device that uses the organic electroluminescent element as a light source. There is a lighting system that includes multiple organic electroluminescent elements and a controller that controls the lit state and the unlit state of the multiple organic electroluminescent elements. The organic electroluminescent element is light transmissive by making the second electrode of the element in a fine micro-fabricated configuration. Good light emission characteristics are desirable in such an organic electroluminescent element.

DETAILED DESCRIPTION

Figure 1:
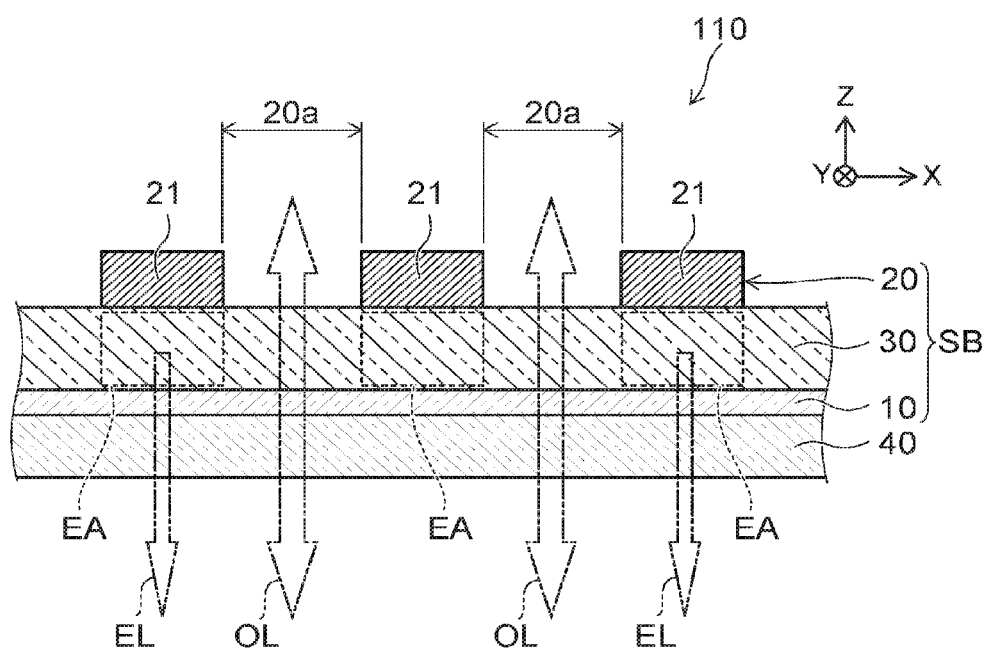
FIG. 1 is a cross-sectional view schematically showing an organic electroluminescent element according to a first embodiment.

According to one embodiment, an organic electroluminescent element includes a first electrode, an organic layer, and a second electrode. The first electrode is light-transmissive. The organic layer is provided on the first electrode. The second electrode is provided on the organic layer. The second electrode is light-reflective and includes a first conductive portion and a second conductive portion. The first conductive portion extends in a first direction. The second conductive portion extends in a second direction intersecting the first direction. The second conductive portion intersects the first conductive portion. A length in the first direction of the first conductive portion is longer than 1 mm and not more than 47 mm. A length in the second direction of the second conductive portion is longer than 1 mm and not more than 47 mm.

Various embodiments will be described hereinafter in detail with reference to the accompanying drawings.

The drawings are schematic or conceptual; and the relationships between the thicknesses and widths of portions, the proportions of sizes between portions, etc., are not necessarily the same as the actual values thereof. Further, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

Embodiments of the invention can provide an organic electroluminescent element, a lighting device, a lighting system, and a method for manufacturing the organic electroluminescent element that have good light emission characteristics.

First Embodiment

FIG. 1 is a cross-sectional view schematically showing an organic electroluminescent element according to a first embodiment.

As shown in FIG. 1, the organic electroluminescent element 110 includes a stacked body SB. The stacked body SB includes a first electrode 10, a second electrode 20, and an organic layer 30. FIG. 1 shows an enlarged portion of the organic electroluminescent element 110 for convenience.

The first electrode 10 is light-transmissive. The first electrode 10 is, for example, a transparent electrode. The organic layer 30 is provided on the first electrode 10. The organic layer 30 includes an organic light-emitting layer. The organic layer 30 is light-transmissive. The organic layer 30 is, for example, light-transmissive in the unlit state.

The second electrode 20 is provided on the organic layer 30. In other words, the organic layer 30 is provided between the first electrode 10 and the second electrode 20. The second electrode 20 is light-reflective. The light reflectance of the second electrode 20 is higher than the light reflectance of the first electrode 10. In this specification, the state in which the light reflectance is higher than the light reflectance of the first electrode 10 is called light-reflective.

For example, the organic electroluminescent element 110 further includes a substrate 40. The stacked body SB is provided on the substrate 40. In other words, in the example, the first electrode 10 is provided on the substrate 40; the organic layer 30 is provided on the first electrode 10; and the second electrode 20 is provided on the organic layer 30. The substrate 40 is light-transmissive. The substrate 40 is, for example, transparent.

Here, a direction parallel to the stacking direction of the stacked body SB (the direction from the first electrode 10 toward the second electrode 20) is taken as a Z-axis direction. In other words, the Z-axis direction is a direction perpendicular to the film surfaces of the first electrode 10, the second electrode 20, and the organic layer 30. One direction perpendicular to the Z-axis direction is taken as an X-axis direction. A direction perpendicular to the X-axis direction and the Z-axis direction is taken as a Y-axis direction.

Figure 2:
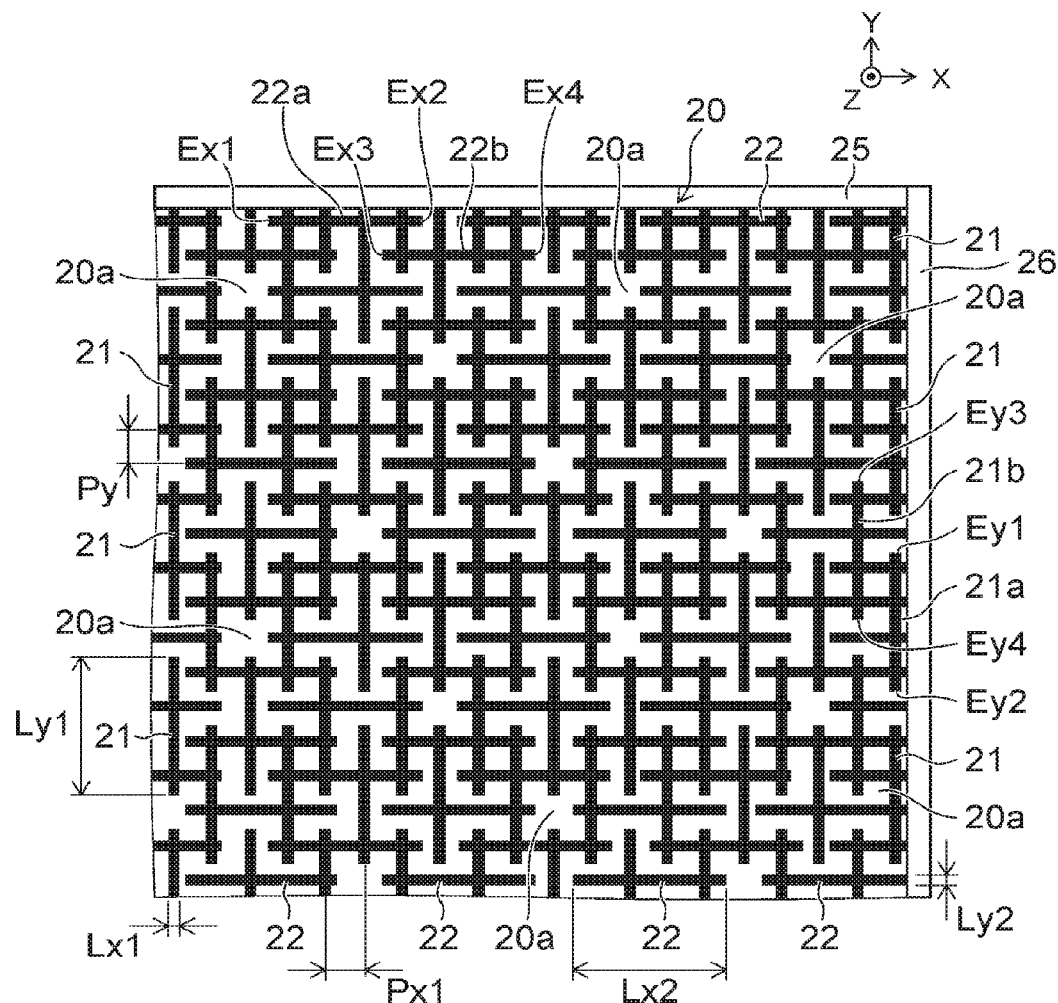
FIG. 2 is a plan view schematically showing an example of the second electrode of the organic electroluminescent element according to the first embodiment.

FIG. 2 is a plan view schematically showing an example of the second electrode of the organic electroluminescent element according to the first embodiment.

As shown in FIG. 2, the second electrode 20 includes a first conductive and a second conductive portion 22. In the embodiment, the second electrode 20 includes multiple first conductive portions 21 and multiple second conductive portions 22. FIG. 2 shows an enlarged portion of the second electrode 20 for convenience.

The first conductive portion 21 extends in a first direction. In the embodiment, each of the multiple first conductive portions 21 extends in the first direction. In other words, the direction of a line connecting one point of the first conductive portion 21 to one other point of the first conductive portion 21 when the line is the longest is taken as the first direction. The multiple first conductive portions 21 are arranged in a second direction intersecting the first direction. In the example, the multiple first conductive portions 21 extend in the Y-axis direction and are arranged in the X-axis direction. In other words, in the example, the second direction is substantially perpendicular to the first direction. The second direction is not limited to a direction perpendicular to the first direction and may be any direction intersecting the first direction. For example, the multiple first conductive portions 21 are arranged at substantially uniform spacing in the X-axis direction.

The second conductive portion 22 extends in the second direction. In the embodiment, each of the multiple second conductive portions 22 extends in the second direction. The multiple second conductive portions 22 are arranged in the first direction. In the example, the multiple second conductive portions 22 extend in the X-axis direction and are arranged in the Y-axis direction. For example, the multiple second conductive portions 22 are arranged at substantially uniform spacing in the Y-axis direction. The second conductive portion 22 intersects one of the multiple first conductive portions 21. Here, to "intersect," it is sufficient for at least a portion of the first conductive portion 21 and the second conductive portion 22 to overlap. The overlapping portion may be an end portion or may be a central portion.

The second electrode 20 further includes a first power supplier 25 and a second power supplier 26. The first power supplier 25 and the second power supplier 26 are used to electrically connect the second electrode 20 to an external device. In other words, the first power supplier 25 and the second power supplier 26 are electrode pads.

In the example, the first power supplier 25 and the second power supplier 26 are provided along the outer edge of the second electrode 20. The first power supplier 25 extends in the X-axis direction along one side of the second electrode 20. The second power supplier 26 extends in the Y-axis direction along one other side of the second electrode 20. The configurations of the first power supplier 25 and the second power supplier 26 are not limited thereto; and any configuration that can be electrically connected to the external device may be used.

The first power supplier 25 is electrically connected to the first conductive portion 21. The second power supplier 26 is electrically connected to the second conductive portion 22. In the example, the first power supplier 25 and the second power supplier 26 are electrically connected to the multiple first conductive portions 21 and the multiple second conductive portions 22. Thereby, each of the multiple first conductive portions 21 and the multiple second conductive portions 22 can be provided with a current by at least one of the first power supplier 25 or the second power supplier 26. The first power supplier 25 and the second power supplier 26 are provided as necessary and are omissible. Only one of the first power supplier 25 or the second power supplier 26 may be provided.

The second electrode 20 further has multiple openings 20a. The multiple openings 20a are the portions between the multiple first conductive portions 21 and the multiple second conductive portions 22. For example, a portion of the organic layer 30 is exposed at each of the multiple openings 20a. For example, multiple portions of the organic layer 30 are exposed at the multiple openings 20a. In other words, the configuration of the second electrode 20 is a mesh configuration.

In the organic electroluminescent element 110, the portion of the organic layer 30 between the first electrode 10 and the first conductive portion 21 and the portion of the organic layer 30 between the first electrode 10 and the second conductive portion 22 are light-emitting regions EA. Emitted light EL that is emitted from the light-emitting regions EA passes through the first electrode 10 and the substrate 40 and is emitted outside the organic electroluminescent element 110. A portion of the emitted light EL is reflected by the second electrode 20, passes through the organic layer 30, the first electrode 10, and the substrate 40, and is emitted to the outside. In other words, the organic electroluminescent element 110 is a single-side emitting type.

In the organic electroluminescent element 110, outside light OL that enters from the outside passes through the multiple openings 20a, the organic layer 30, the first electrode 10, and the substrate 40. Thus, in the organic electroluminescent element 110, the outside light OL that enters the organic electroluminescent element 110 from the outside is transmitted while emitting the emitted light EL. Thus, the organic electroluminescent element 110 is light-transmissive. Thereby, in the organic electroluminescent element 110, the image of the background can be recognized via the organic electroluminescent element 110. In other words, the organic electroluminescent element 110 is a light source having a thin-film configuration or a plate configuration that can be see-through.

Thus, according to the organic electroluminescent element 110 of the embodiment, a light-transmissive organic electroluminescent element can be provided. In the case where the organic electroluminescent element 110 is applied to a lighting device, various new applications other than the lighting function become possible due to the function of transmitting the background image.

A length Ly1 in the Y-axis direction of the first conductive portion 21 is, for example, longer than 1 mm and not more than 47 mm.

In the case where the multiple first conductive portions 21 are provided, the length Ly1 of each of the first conductive portions 21 is, for example, not less than twice a spacing Py in the Y-axis direction of the multiple second conductive portions 22. Thereby, each of the multiple first conductive portions 21 intersects at least two second conductive portions 22.

In other words, the spacing Py is the distance between the centers in the Y-axis direction of the multiple second conductive portions 22. The spacing Py is, for example, 500 μm. Accordingly, the length Ly1 of the first conductive portion 21 is set to be, for example, longer than 1 mm.

A length Lx2 in the X-axis direction of the second conductive portion 22 is, for example, longer than 1 mm and not more than 47 mm.

In the case where the multiple second conductive portions 22 are provided, the length Lx2 of each of the second conductive portions 22 is, for example, not less than twice a spacing Px in the X-axis direction of the multiple first conductive portions 21. Thereby, each of the multiple second conductive portions 22 intersects at least two first conductive portions 21.

In other words, the spacing Px is the distance between the centers in the X-axis direction of the multiple first conductive portions 21. The spacing Px is, for example, 500 μm. Accordingly, the length Lx2 of the second conductive portion 22 is, for example, longer than 1 mm.

In the example, the multiple first conductive portions 21 are arranged in the X-axis direction and arranged in the Y-axis direction. In other words, the first conductive portion 21 includes a discontinuous portion in the Y-axis direction. Thus, the first conductive portion 21 does not have one continuous line configuration extending in the Y-axis direction.

In the example, the multiple second conductive portions 22 are arranged in the Y-axis direction and arranged in the X-axis direction. In other words, the second conductive portion 22 includes a discontinuous portion in the X-axis direction. Thus, the second conductive portion 22 does not have one continuous line configuration extending in the X-axis direction.

As described above, the length Ly1 of the first conductive portion 21 is, for example, longer than 1 mm and not more than 47 mm. Conversely, the length in the Y-axis direction of the second electrode 20 (the length in the Y-axis direction of the organic electroluminescent element 110) is, for example, not less than twice the length Ly1 of the first conductive portion 21. In other words, the second electrode 20 includes, for example, two or more first conductive portions 21 in the Y-axis direction. Accordingly, in the organic electroluminescent element 110, the multiple first conductive portions 21 are arranged in the Y-axis direction.

As described above, the length Lx2 of the second conductive portion 22 is, for example, longer than 1 mm and not more than 47 mm. Conversely, the length in the X-axis direction of the second electrode 20 (the length in the X-axis direction of the organic electroluminescent element 110) is, for example, not less than twice the length Lx2 of the second conductive portion 22. In other words, the second electrode 20 includes, for example, two or more second conductive portions 22 in the X-axis direction. Accordingly, in the organic electroluminescent element 110, the multiple second conductive portions 22 are arranged in the X-axis direction.

In the organic electroluminescent element 110, the positions of end portions Ey1 and Ey2 in the Y-axis direction of one first conductive portion 21a of the multiple first conductive portions 21 are different from the positions of end portions Ey3 and Ey4 in the Y-axis direction of one other first conductive portion 21b adjacent to the one first conductive portion 21a in the X-axis direction. In other words, the positions of the two first conductive portions 21a and 21b arranged in the X-axis direction are shifted from each other in the Y-axis direction. In the X-axis direction, for example, the first conductive portion 21 is adjacent to two first conductive portions 21.

In the organic electroluminescent element 110, the positions of end portions Ex1 and Ex2 in the X-axis direction of one second conductive portion 22a of the multiple second conductive portions 22 are different from the positions of end portions Ex3 and Ex4 in the X-axis direction of one other second conductive portion 22b adjacent to the one second conductive portion 22a in the Y-axis direction. In other words, the positions of the two second conductive portions 22a and 22b arranged in the Y-axis direction are shifted from each other in the X-axis direction. For example, the second conductive portion 22 is adjacent to two second conductive portions 22 in the Y-axis direction.

Thus, the positions in the Y-axis direction of the first conductive portions 21 are shifted; and the positions in the X-axis direction of the second conductive portions 22 are shifted. Thereby, for example, the first conductive portions 21 and the second conductive portions 22 can appropriately intersect each other. In other words, the undesirable occurrence of broken portions in each of the first conductive portions 21 and the second conductive portions 22 can be suppressed. In other words, the first conductive portions 21 and the second conductive portions 22 can be continuous with each other. Accordingly, the first conductive portions 21 and the second conductive portions 22 are connected to the first power supplier 25 or the second power supplier 26 directly or indirectly. In other words, the first conductive portions 21 and the second conductive portions 22 are directly connected to the first power supplier 25 or the second power supplier 26, or are connected to the first power supplier 25 or the second power supplier 26 via at least one of another first conductive portion 21 or another second conductive portion 22.

For example, the configurations of the first conductive portions 21 and the configurations of the second conductive portions 22 are substantially the same except for the difference between the extension directions. For example, the configuration of the second conductive portions 22 rotated substantially 90° is substantially the same as the configuration of the first conductive portions 21.

Figure 3:
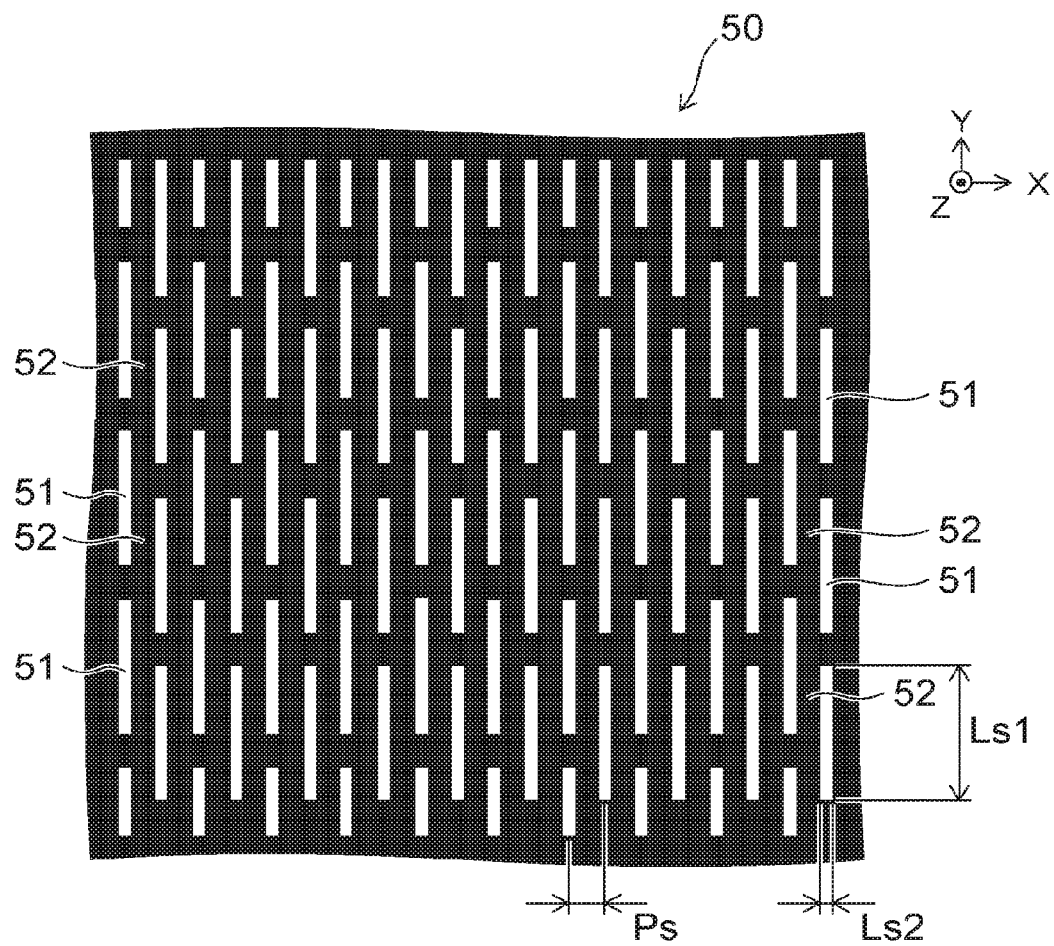
FIG. 3 is a schematic view showing an example of a mask.

FIG. 3 is a schematic view showing an example of a mask.

FIG. 3 schematically shows a mask 50 used to form the second electrode 20.

FIG. 3 is a plan view schematically showing an example of the mask 50. FIG. 3 displays an enlarged portion of the mask 50 for convenience. For example, vapor deposition is used to form the second electrode 20. The mask 50 is, for example, the mask used in the vapor deposition. The second electrode 20 that is provided on the organic layer 30 is formed by, for example, a dry process such as vapor deposition, etc.

As shown in FIG. 3, the mask 50 includes multiple slit portions 51 and multiple mask portions 52. For example, the multiple slit portions 51 extend in the Y-axis direction and are arranged in the X-axis direction. For example, the multiple mask portions 52 are provided respectively in the regions between the multiple slit portions 51.

The configurations of the slit portions 51 and the mask portions 52 correspond to the configurations of the first conductive portions 21 and the second conductive portions 22. In the example, for each of the slit portions 51, the positions of two slit portions 51 arranged in the X-axis direction are shifted from each other in the Y-axis direction.

A length LS1 of the slit portion 51 is, for example, longer than 1 mm and not more than 47 mm. Also, the length LS1 of each of the multiple slit portions 51 is, for example, not less than twice a spacing Ps in the X-axis direction of the multiple slit portions 51.

In other words, the spacing Ps is the distance between the centers in the X-axis direction of the multiple slit portions 51. The spacing Ps is, for example, 500 μm. Accordingly, the length LS1 of the slit portion 51 is, for example, longer than 1 mm. Thus, the lengths LS1 and LS2 of the slit portion 51 are set.

For example, the mask 50 is mounted in the vapor deposition apparatus or the like in a state in which the periphery of the mask 50 is under tension. Accordingly, in some cases, the mask 50 undesirably distorts; and there are cases where the second electrode 20 cannot be formed in the desired configuration. In the embodiment, for example, the distortion of the mask 50 can be suppressed; and the formation precision of the second electrode 20 can be increased.

FIG. 4A to FIG. 4D are schematic views showing an example of a calculation model used to calculate the distortion of the mask portion.

Figure 4A:
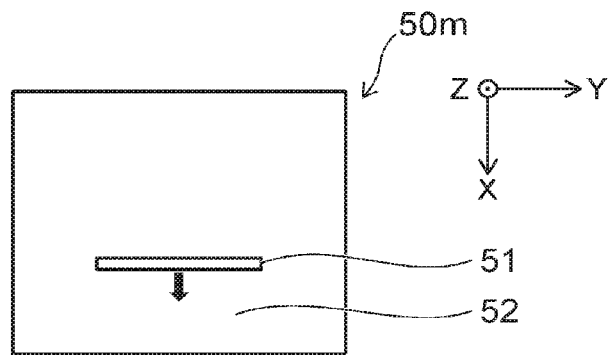
FIG. 4A to FIG. 4D are schematic views showing an example of a calculation model used to calculate the distortion of the mask portion.
Figure 4B:
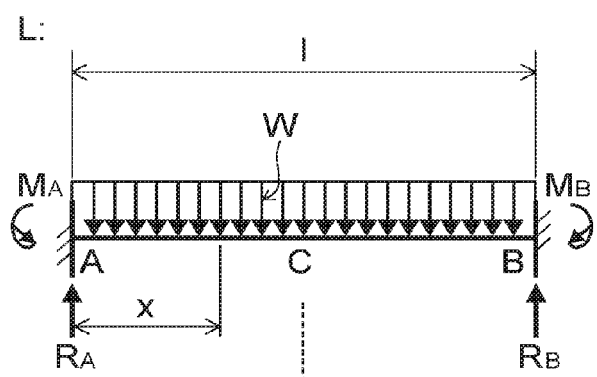
Figure 4C:
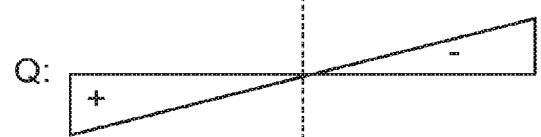
Figure 4D:

As shown in FIG. 4A to FIG. 4D, a two-end fixed structure is employed in a calculation model 50m of the mask portion 52 to simplify the calculations. A uniformly distributed load is considered for the calculation model 50m. FIG. 4B is the load diagram of the calculation model 50m. FIG. 4C is a shear diagram of the calculation model 50m. FIG. 4D is a bending moment diagram of the calculation model 50m. Using the calculation model 50m, the distortion amount (the deflection amount) in the width direction of the mask portion 52 when a tensile force is applied to the mask portion 52 in the width direction (e.g., the X-axis direction) is calculated. It is assumed that the slit portion 51 and the mask portion 52 used in the calculations are the slit portion 51 and the mask portion 52 positioned at the end-most position in the width direction. Here, the distortion amount is, for example, the difference between the minimum value and the maximum value of the position in the width direction of the mask portion 52.

For example, the distortion amount of the mask portion 52 can be determined by the following Formula (1) to Formula (7).

$$W = wl \quad \text{[Formula 1]}$$

$$R_A = R_B = Q_A = -Q_B = \frac{wl}{2} \quad \text{[Formula 2]}$$

$$Q_x = w\left(\frac{l}{2} - x\right) \quad \text{[Formula 3]}$$

$$M_A = M_B = -\frac{w \cdot l^2}{12}, M_C = \frac{w \cdot l^2}{24} \quad \text{[Formula 4]}$$

$$M_x = \frac{w}{2}(lx - x^2) - \frac{wl^2}{12} = \frac{wl^2}{2}\left(\frac{1}{6} - \frac{x}{l} + \frac{x^2}{l^2}\right) \quad \text{[Formula 5]}$$

$$\delta_C = \frac{wl^4}{384EI} \quad \text{[Formula 6]}$$

$$\delta_x = \frac{w \cdot l^2 x^2}{24EI}\left(1 - \frac{2x}{l} + \frac{x^2}{l^2}\right) \quad \text{[Formula 7]}$$

In each of Formula (1) to Formula (7), W is the total load; w is the load at the prescribed position x; l is the length of the mask portion 52 (the slit portion 51); $R_A$ is the reaction force at point A; $R_B$ is the reaction force at point B; $Q_A$ is the shear force at point A; $Q_B$ is the shear force at point B; $Q_x$ is the shear force at point x; $M_A$ is the bending moment at point A; $M_B$ is the bending moment at point B; $M_C$ is the bending moment at point C (the center point); $M_x$ is the bending moment at point x; $\delta_C$ is the distortion amount at point C; and $\delta_x$ is the distortion amount at point x.

Figure 5:
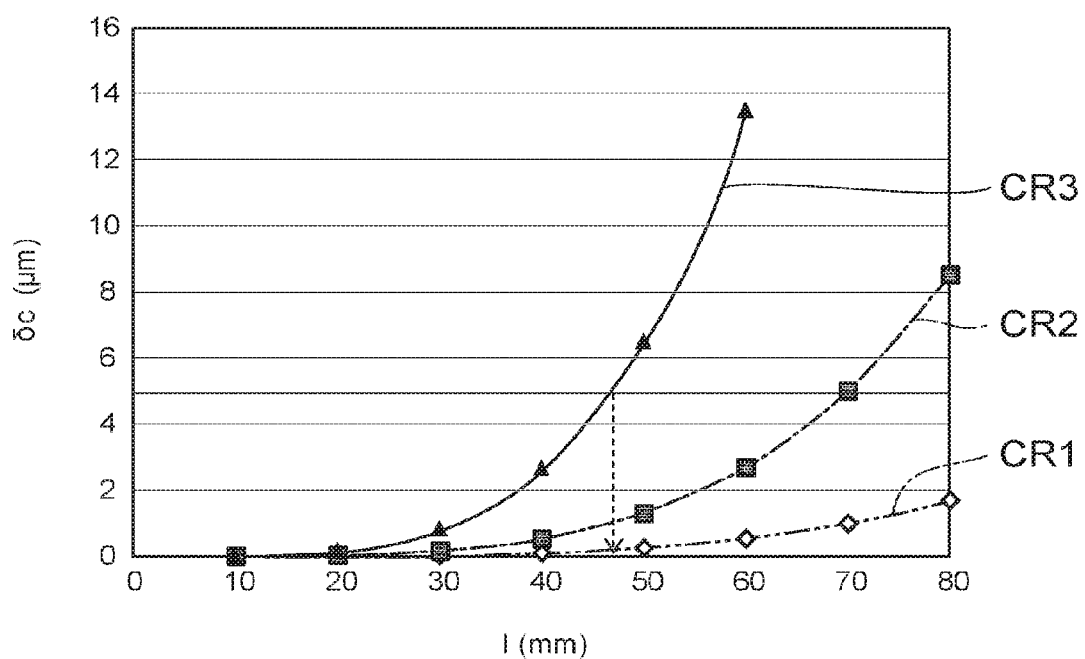
FIG. 5 is a graph schematically showing an example of the calculation results of the distortion amount of the mask portion.

FIG. 5 is a graph schematically showing an example of the calculation results of the distortion amount of the mask portion.

FIG. 5 shows the relationship between the length l of the mask portion 52 and the distortion amount $\delta_C$. In FIG. 5, the horizontal axis is the length l (mm) of the mask portion 52 (the slit portion 51); and the vertical axis is the distortion amount $\delta_C$ (mm).

FIG. 5 is an example of the calculation results in the case where stainless steel is used as the mask 50. Here, the calculations are performed for the slit portion 51 most proximal to the outer edge of the mask portion 52. In the calculations, the width of the mask portion 52 (the width of the mask portion 52 between the outer edge of the mask portion B2 and the slit portion 51 most proximal to the outer edge of the mask portion 52) was set to 10 mm. The thickness of the mask portion 52 was set to 50 μm. The cross section moment of inertia of area of the mask portion 52 was set to $4.17 \times 10^{-12}$ mm$^4$. The distributed load was set to $3.16 \times 10^{-7}$ N. The Young's modulus was set to 200 GPa. The specific gravity was set to 7.9. In the calculations, the tensile force applied to the mask 50 was set to 10 N, 50 N, and 250 N; and the relationship between the distortion amount and the length of the mask portion 52 was determined for each of the three tensile forces. In FIG. 5, CR1 is the calculation result when the tensile force is 10 N. CR2 is the calculation result when the tensile force is 50 N. CR3 is the calculation result when the tensile force is 250 N.

As shown in FIG. 5, the distortion amount $\delta_C$ of the mask portion 52 increases as the length l of the mask portion 52 increases. For example, an alloy such as stainless steel or the like is used as the material of the mask 50. The tensile force of pulling the mask 50 in the vapor deposition apparatus or the like is about 10 N to 250 N. In such a case, if the width of the mask portion 52 is 10 mm and the thickness of the mask portion 52 is 50 μm, the distortion amount in the width direction of the mask portion 52 is 5 μm or less by setting the length to be 47 mm or less. Here, 5 μm corresponds to 5% of the width of the mask portion 52 when the width of the mask portion 52 is set to, for example, 100 μm; and such a slight distortion amount is tolerable. Accordingly, the mask 50 in which the length of the slit portion 51 is greater than 1 mm and not more than 47 mm is used. Thereby, the distortion amount in the width direction of the first conductive portion 21 and the distortion amount in the width direction of the second conductive portion 22 can be set to be 5 μm or less. For example, the formation precision of the second electrode 20 can be increased. Accordingly, the length LS1 of the multiple slit portions 51 is set to be longer than 1 mm and not more than 47 mm. Thereby, the distortion amount of the mask portion 52 can be 5% of the width of the mask portion 52 or less.

Figure 6A:
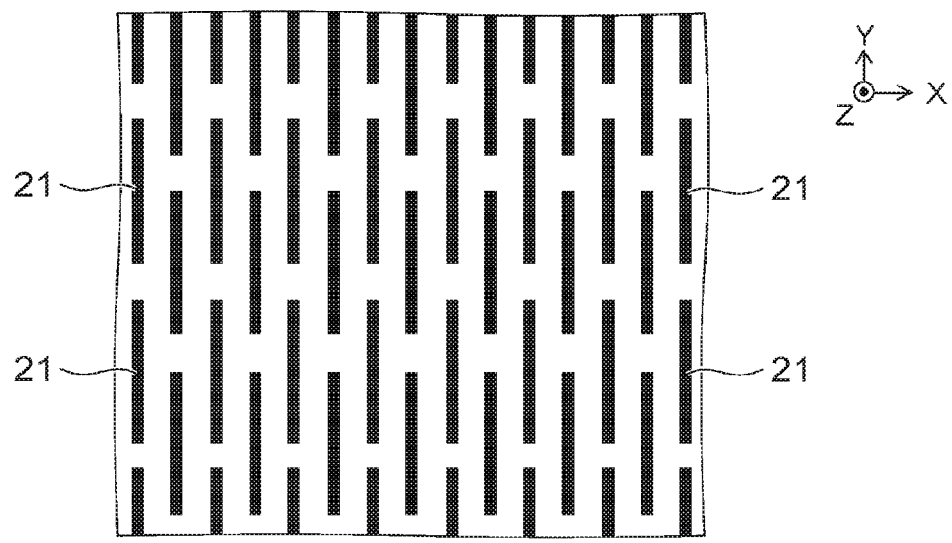
FIG. 6A and FIG. 6B are plan views schematically showing an example of a method for forming the second electrode.
Figure 6B:
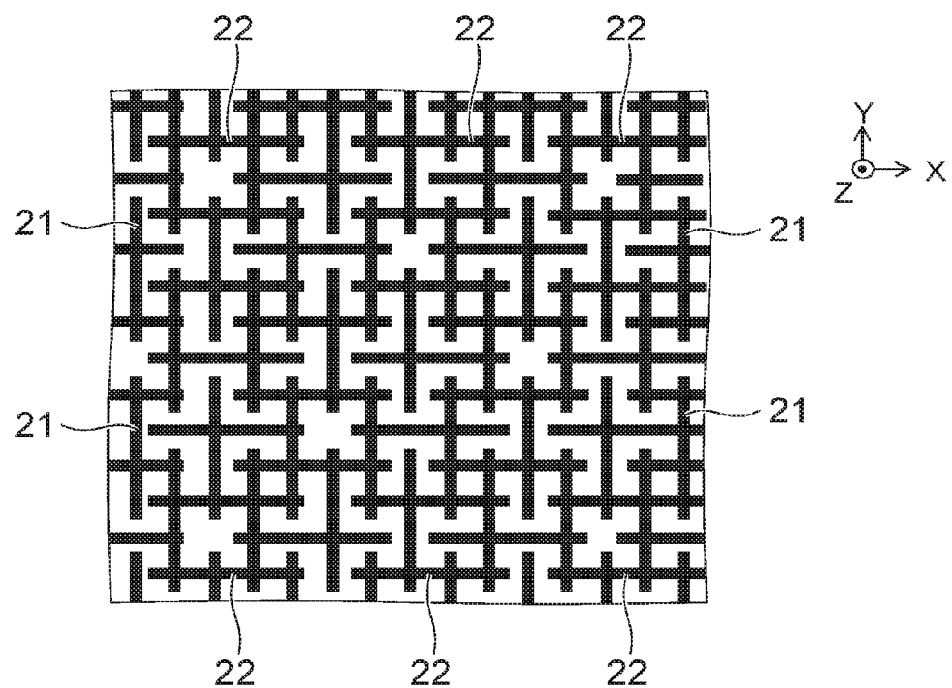

FIG. 6A and FIG. 6B are plan views schematically showing an example of a method for forming the second electrode.

To form the second electrode 20 as shown in FIG. 6A, first, vapor deposition is performed using the mask 50 recited above; and the multiple first conductive portions 21 are formed on the organic layer 30 by transferring the pattern of the slit portions 51.

Then, the orientation of the slit portions 51 is changed by rotating the mask 50. In the example, the mask 50 is rotated substantially 90°.

As shown in FIG. 6B, by performing vapor deposition again using the mask 50, the multiple second conductive portions 22 are formed on the organic layer 30 and the first conductive portions 21. Thereby, the second electrode 20 is formed. Contrary to the description recited above, the first conductive portions 21 may be formed after forming the second conductive portions 22.

Figure 7A:
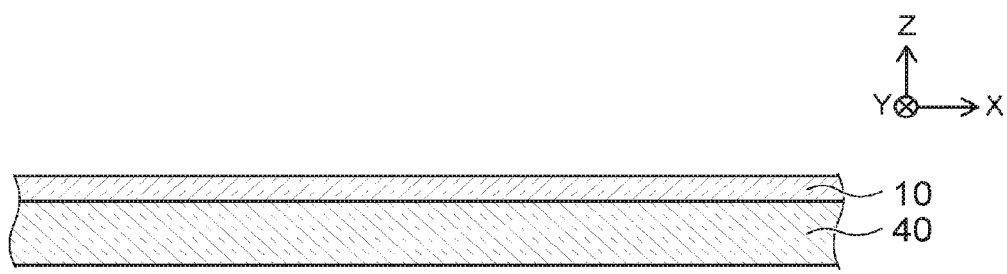
FIG. 7A to FIG. 7C are cross-sectional views schematically showing an example of the manufacturing process order of the organic electroluminescent element according to the first embodiment.
Figure 7B:
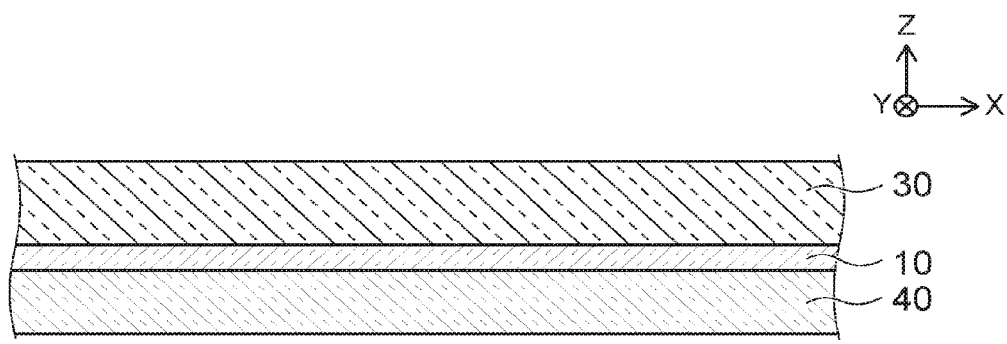
Figure 7C:
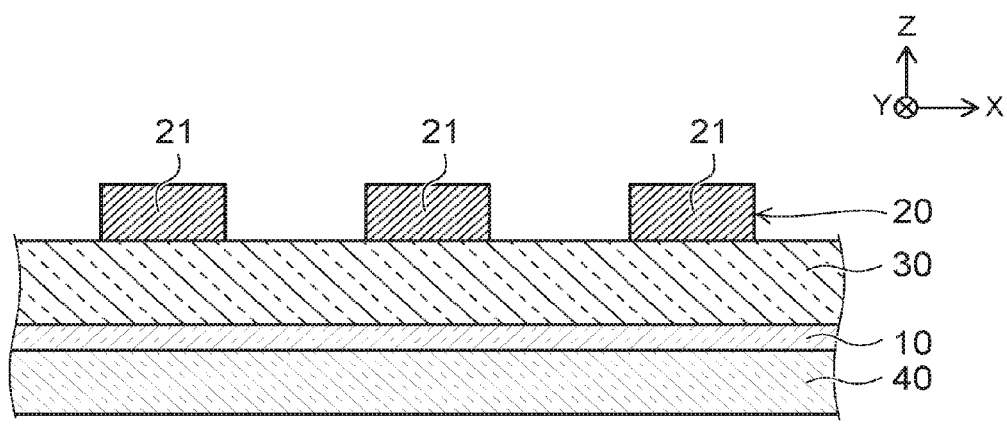

FIG. 7A to FIG. 7C are cross-sectional views schematically showing an example of the manufacturing process order of the organic electroluminescent element according to the first embodiment.

When manufacturing the organic electroluminescent element 110 as shown in FIG. 7A, first, the first electrode 10 is formed on the substrate 40.

As shown in FIG. 7B, the organic layer 30 is formed on the first electrode 10.

As shown in FIG. 7C, the second electrode 20 is formed on the organic layer 30.

As described above, the second electrode 20 is formed using the mask 50. For example, the first conductive portions 21 are formed using the mask 50; and the second conductive portions 22 are formed by changing the orientation of the mask 50.

Thereby, the organic electroluminescent element 110 is completed.

In the light-transmitting organic electroluminescent element, the electrodes are formed on the organic layer using a mask in which slits having a stripe configuration are provided. However, in the case where the mask of the slits having the stripe configuration is used, the portions between the slits of the mask (the portions corresponding to the mask portions 52) undesirably distort as the surface area of the element is increased. For example, the distortion amount of the portions between the slits undesirably becomes greater than 5 μm.

For example, the distortion of the mask causes the formation precision of the electrodes to decrease. For example, the electrodes twist; and blurring of the configurations of the edge portions of the electrodes occurs. For example, the twisting and blurring of the electrodes appear as blurring and unevenness of the light emitted from the organic layer. In other words, the decrease of the formation precision of the electrodes causes the decrease of the light emission characteristics of the organic electroluminescent element.

Conversely, in the organic electroluminescent element 110 according to the embodiment, the length Ly1 of the first conductive portion 21 is set to be longer than 1 mm and not more than 47 mm. Also, the length Lx2 of the second conductive portion 22 is set to be longer than 1 mm and not more than 47 mm. In other words, in the organic electroluminescent element 110, excessively long first conductive portions 21 and second conductive portions 22 are not formed. For the first conductive portion 21 extending in the Y-axis direction, the multiple first conductive portions 21 that extend in the Y-axis direction are arranged in a straight line configuration in the Y-axis direction instead of providing one long first conductive portion 21. For the second conductive portion 22 extending in the X-axis direction, the multiple second conductive portions 22 that extend in the X-axis direction are arranged in a straight line configuration in the X-axis direction instead of providing one long second conductive portion 22.

In the organic electroluminescent element 110 according to the embodiment, the length LS1 of the slit portion 51 of the mask 50 can be set to be longer than 1 mm and not more than 47 mm. The distortion amount in the width direction of the mask portion 52 can be set to be 5 μm or less. Accordingly, in the organic electroluminescent element 110 according to the embodiment, for example, the decrease of the formation precision of the second electrode 20 can be suppressed. For example, the twisting and blurring of the second electrode 20 can be suppressed. Thereby, in the organic electroluminescent element 110, the blurring and unevenness of the light emitted from the organic layer 30 can be suppressed; and the light emission characteristics can be improved. In the organic electroluminescent element 110, for example, the light emission luminance in the plane of the organic layer 30 can be uniform.

In the second electrode 20 having the slit configuration, in the case where defects such as leaks to the first electrode 10, electrical disconnect, etc., occur, the luminance of the portion beyond the defect location undesirably decreases. For example, the portion beyond the defect location substantially no longer emits light. Because the decrease of the luminance occurs in a line configuration from the defect location, the decrease of the luminance undesirably is highly noticeable.

In the organic electroluminescent element 110 according to the embodiment, the second electrode 20 has a mesh configuration. In the second electrode 20 having the mesh configuration, even in the case where defects such as leaks, electrical disconnect, etc., occur, the current is supplied also to the portion beyond the defect location via the first conductive portion 21 and the second conductive portion 22 at the periphery of the defect. For example, the region where the luminance decreases can be suppressed to be only the vicinity of the defect location. In other words, the multiple first conductive portions 21 and the multiple second conductive portions 22 are provided in the second electrode 20. Thereby, the light emission characteristics of the organic electroluminescent element 110 can be improved further.

Although the second electrode 20 has a mesh configuration in the example, for example, a stripe configuration may be used. In other words, the second electrode 20 may include only the first conductive portions 21. For example, in the case where the element size of the organic electroluminescent element 110 is small, the second electrode 20 that includes only the first conductive portions 21 in which the length Ly1 is longer than 1 mm and not more than 47 mm may be used.

Figure 8:
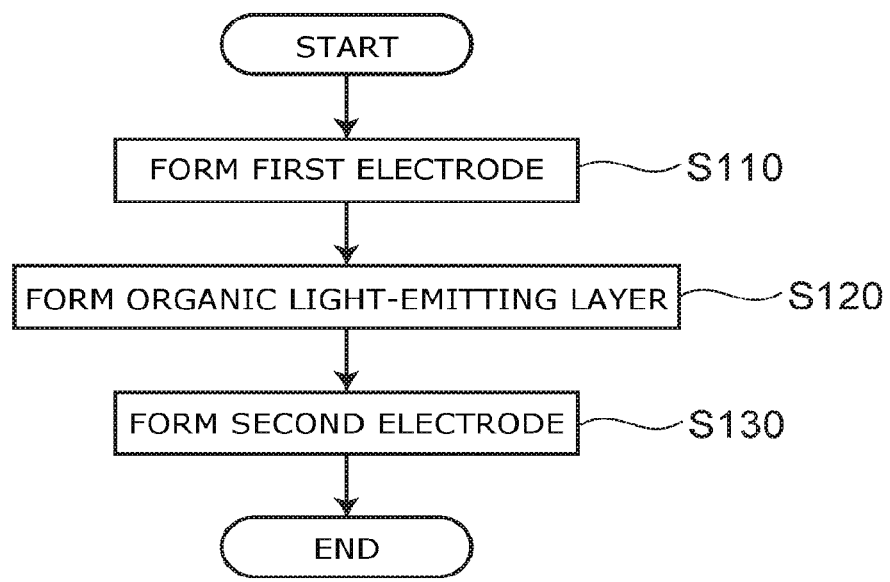
FIG. 8 is a flowchart schematically showing a method for manufacturing the organic electroluminescent element according to the first embodiment.

FIG. 8 is a flowchart schematically showing a method for manufacturing the organic electroluminescent element according to the first embodiment.

As shown in FIG. 8, the method for manufacturing the organic electroluminescent element according to the embodiment includes step S110 of forming the first electrode 10, step S120 of forming the organic layer 30, and step S130 of forming the second electrode 20. Step S130 of forming the second electrode 20 includes, for example, a step of forming the multiple first conductive portions 21, and a step of forming the multiple second conductive portions 22.

For example, the processing described in reference to FIG. 7A is implemented in step S110. For example, the processing described in reference to FIG. 7B is implemented in step S120. For example, the processing described in reference to FIG. 7C is implemented in step S130.

Thereby, an organic electroluminescent element having good light emission characteristics can be manufactured.

Figure 9:
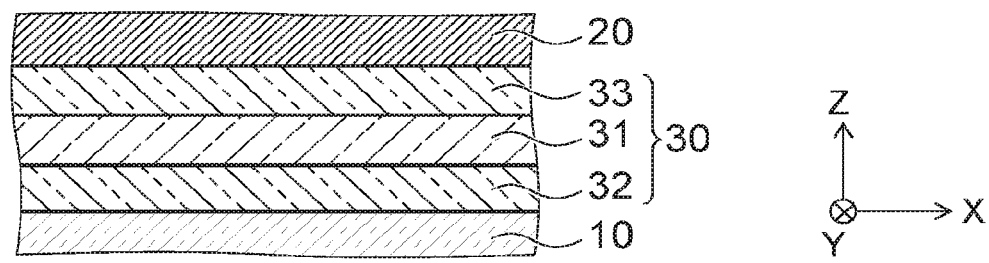
FIG. 9 is a cross-sectional view schematically showing a portion of the organic electroluminescent element according to the first embodiment.

FIG. 9 is a cross-sectional view schematically showing a portion of the organic electroluminescent element according to the first embodiment.

As shown in FIG. 9, the organic layer 30 includes a first layer 31. The organic layer 30 may further include at least one of a second layer 32 or a third layer 33 as necessary. The first layer 31 emits light of the wavelength of visible light. The second layer 32 is provided between the first layer 31 and the first electrode 10. The third layer 33 is provided between the first layer 31 and the second electrode 20.

The first layer 31 may include, for example, a material such as $Alq_3$ (tris(8-hydroxyquinolinolato)aluminum), F8BT (poly(9,9-dioctylfluorene-co-benzothiadiazole), PPV (poly-paraphenylene vinylene), etc. The first layer 31 may include a mixed material of a host material and a dopant added to the host material. For example, CBP (4,4'-N,N'-bis(dicarbazolyl)-biphenyl), BCP (2,9-dimethyl-4,7 diphenyl-1,10-phenanthroline), TPD (4,4'-bis-N-3 methyl phenyl-N-phenylamino biphenyl), PVK (polyvinyl carbazole), PPT (poly(3-phenylthiophene)), etc., may be used as the host material. For example, FIrpic (iridium(III)-bis(4,6-di-fluorophenyl)-pyridinate-N,C2'-picolinate), $Ir(ppy)_3$ (tris(2-phenylpyridine)iridium), FIr6 (bis(2,4-difluorophenylpyridinato)-tetrakis(1-pyrazolyl)borate-iri dium (III)), etc., may be used as the dopant material. The first layer 31 is not limited to these materials.

For example, the second layer 32 functions as a hole injection layer. The hole injection layer includes, for example, at least one of PEDPOT:PPS (poly(3,4-ethylenedioxythiophene)-poly(styrenesulfonic acid)), CuPc (copper phthalocyanine), $MoO_3$ (molybdenum trioxide), or the like. For example, the second layer 32 functions as a hole transport layer. The hole transport layer includes, for example, at least one of α-NPD (4,4'-bis[N-(1-naphthyl)-N-phenylamino]biphenyl), TAPC (1,1-bis[4-N,N-di(p-tolyl)amino]phenyl]cyclohexane), m-MTDATA (4,4',4"-tris[phenyl(m-tolyl)amino]triphenylamine), TPD (bis(3-methyl phenyl)-N,N'-diphenylbenzidine), TCTA (4,4',4"-tri(N-carbazolyl)triphenylamine), or the like. For example, the second layer 32 may have a stacked structure of a layer that functions as a hole injection layer and a layer that functions as a hole transport layer. The second layer 32 may include a layer other than the layer that functions as the hole injection layer and the layer that functions as the hole transport layer. The second layer 32 is not limited to these materials.

The third layer 33 may include, for example, a layer that functions as an electron injection layer. The electron injection layer includes, for example, at least one of lithium fluoride, cesium fluoride, lithium quinoline complex, or the like. The third layer 33 may include, for example, a layer that functions as an electron transport layer. The electron transport layer includes, for example, at least one of Alq3 (tris(8 quinolinolato)aluminum(III)), BAlq (bis(2-methyl-8-quinolilato)(p-phenylphenolate)aluminum), Bphen (bathophenanthroline), 3TPYMB (tris[3-(3-pyridyl)-mesityl]borane), or the like. For example, the third layer 33 may have a stacked structure of a layer that functions as an electron injection layer and a layer that functions as an electron transport layer. The third layer 33 may include a layer other than the layer that functions as the electron injection layer and the layer that functions as the electron transport layer. The third layer 33 is not limited to these materials.

For example, the light that is emitted from the organic layer 30 is substantially white light. In other words, the light that is emitted from the organic electroluminescent element 110 is white light. Here, "white light" is substantially white and includes, for example, white light that is reddish, yellowish, greenish, bluish, violet-tinted, etc. The color temperature of the light emitted from the organic layer 30 is, for example, not less than 2800 K and not more than 7000 K.

The first electrode 10 includes, for example, an oxide including at least one element selected from the group consisting of In, Sn, Zn, and Ti. The first electrode 10 may include, for example, gold, platinum, silver, copper, or a film (e.g., NESA, etc.) made using conductive glass including indium oxide, zinc oxide, tin oxide, indium tin oxide (ITO), fluorine-doped tin oxide (FTO), indium zinc oxide, etc. For example, the first electrode 10 functions as a positive electrode. The first electrode 10 is not limited to these materials.

The second electrode 20 includes, for example, at least one of aluminum or silver. For example, the second electrode 20 includes an aluminum film. Further, an alloy of silver and magnesium may be used as the second electrode 20. Calcium may be added to the alloy. For example, the second electrode 20 functions as a negative electrode. The second electrode 20 is not limited to these materials.

The first electrode 10 may be used as a negative electrode; the second electrode 20 may be used as a positive electrode; the second layer 32 may function as an electron injection layer or an electron transport layer; and the third layer 33 may function as a hole injection layer or a hole transport layer.

The substrate 40 includes, for example, transparent glass such as quartz glass, alkali glass, alkali-free glass, etc. The substrate 40 may be, for example, a transparent resin such as polyethylene terephthalate, polycarbonate, polymethyl methacrylate, polypropylene, polyethylene, amorphous polyolefin, a fluoric resin, etc.

Figure 10A:
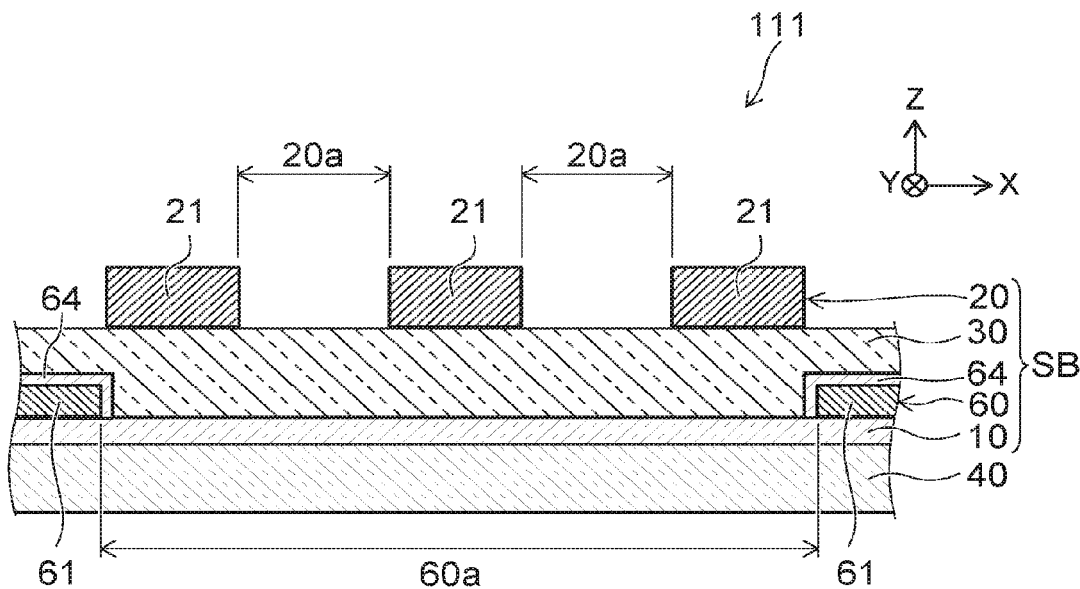
FIG. 10A and FIG. 10B are schematic views showing another organic electroluminescent element according to the first embodiment.
Figure 10B:
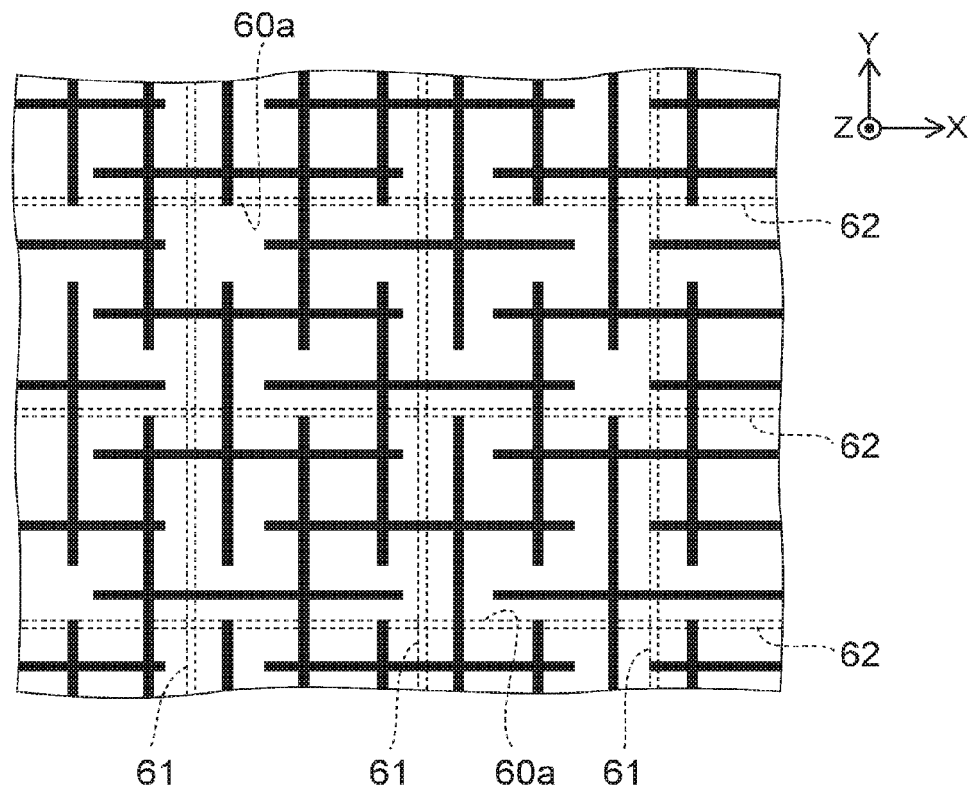

FIG. 10A and FIG. 10B are schematic views showing another organic electroluminescent element according to the first embodiment.

FIG. 10A is a cross-sectional view schematically showing the organic electroluminescent element 111; and FIG. 10B is a schematic plan view. FIG. 10A and FIG. 10B show an enlarged portion of the organic electroluminescent element 111 for convenience.

As shown in FIG. 10A and FIG. 10B, the stacked body SB further includes an interconnect layer 60 in the organic electroluminescent element 111. For example, the interconnect layer 60 is provided between the first electrode 10 and the organic layer 30. In other words, in the organic electroluminescent element 111, the interconnect layer 60 is formed on the first electrode 10; and the organic layer 30 is formed on the interconnect layer 60.

The interconnect layer 60 is electrically connected to the first electrode 10. For example, the interconnect layer 60 contacts the first electrode 10. The conductivity of the interconnect layer 60 is higher than the conductivity of the first electrode 10. The interconnect layer 60 is light-reflective. The light reflectance of the interconnect layer 60 is higher than the light reflectance of the first electrode 10. The interconnect layer 60 is, for example, a metal interconnect. For example, the interconnect layer 60 functions as an auxiliary electrode conducting the current flowing in the first electrode 10. Thereby, in the organic electroluminescent element 111, for example, the amount of current that flows in the first electrode 10 can be more uniform. For example, the light emission luminance in the plane can be more uniform.

In the organic electroluminescent element 111, the stacked body SB further includes an insulating film 64. The insulating film 64 is provided between the interconnect layer 60 and the organic layer 30. The insulating film 64 covers the interconnect layer 60 and suppresses the contact between the interconnect layer 60 and the organic layer 30. The insulating film 64 is, for example, light-transmissive. The insulating film 64 includes, for example, a silicon oxide film, a silicon nitride film, a silicon oxynitride film, etc.

The interconnect layer 60 includes, for example, multiple first interconnect portions 61 and multiple second interconnect portions 62. For example, the multiple first interconnect portions 61 extend in the Y-axis direction and are arranged in the X-axis direction. For example, the multiple second interconnect portions 62 extend in the X-axis direction and are arranged in the Y-axis direction. The second interconnect portions 62 intersect the first interconnect portions 61.

The interconnect layer 60 further has multiple openings 60a. The multiple openings 60a are the portions between the multiple first interconnect portions 61 and the multiple second interconnect portions 62. For example, a portion of the first electrode 10 is exposed in each of the multiple openings 60a. For example, multiple portions of the first electrode 10 are exposed at the multiple openings 60a. In other words, the configuration of the interconnect layer 60 is a mesh configuration. More specifically, the insulating film 64 is provided between the first interconnect portion 61 and the organic layer 30 and between the second interconnect portion 62 and the organic layer 30. For example, the insulating film 64 is not formed in the portions of the openings 60a. In other words, the insulating film 64 has openings where a portion of the first electrode 10 is exposed.

For example, when projected onto a plane (the X-Y plane) perpendicular to the stacking direction of the stacked body SB, the first interconnect portions 61 are disposed between the first conductive portions 21. In other words, when viewed from above, the first interconnect portions 61 are disposed between the first conductive portions 21. For example, the spacing in the X-axis direction between the first interconnect portions 61 is wider than the spacing in the X-axis direction between the first conductive portions 21.

For example, when projected onto the X-Y plane, the second interconnect portions 62 are disposed between the second conductive portions 22. In other words, when viewed from above, the second interconnect portions 62 are disposed between the second conductive portions 22. For example, the spacing in the Y-axis direction between the second interconnect portions 62 is wider than the spacing in the Y-axis direction between the second conductive portions 22.

The lengths in the Y-axis direction of the first interconnect portions 61 are longer than the lengths in the Y-axis direction of the first conductive portions 21. For example, each of the first interconnect portions 61 has one line configuration extending to be continuous in the Y-axis direction. The lengths in the X-axis direction of the second interconnect portions 62 are longer than the lengths in the X-axis direction of the second conductive portions 22. For example, each of the second interconnect portions 62 has one line configuration extending to be continuous in the X-axis direction.

For example, in the interconnect layer 60 that is formed on the first electrode 10, the first interconnect portions 61 and the second interconnect portions 62 can be formed by patterning using photolithography. Therefore, the interconnect layer 60 can be formed to have high definition compared to the second electrode 20 formed using vapor deposition. Therefore, for example, in the interconnect layer 60, the lengths of each of the first interconnect portions 61 and the second interconnect portions 62 can be set to be longer than the lengths of each of the first conductive portions 21 and the second conductive portions 22. Although the interconnect layer 60 has a mesh configuration in the example, the interconnect layer 60 may have a stripe configuration. In other words, the interconnect layer 60 may include only the first interconnect portions 61.

The interconnect layer 60 (the first interconnect portion and the second interconnect portion 62) includes, for example, at least one element selected from the group consisting of Mo, Ta, Nb, Al, Ni, and Ti. For example, the interconnect layer 60 may be a mixed film including the elements selected from the group. The interconnect layer 60 may be a stacked film including the elements. The interconnect layer 60 may include, for example, a stacked film of Nb/Mo/Al/Mo/Nb. For example, the interconnect layer 60 functions as an auxiliary electrode suppressing the potential drop of the first electrode 10. The interconnect layer 60 may function as a lead electrode for current supply. The interconnect layer 60 is not limited to these materials.

Figure 11:
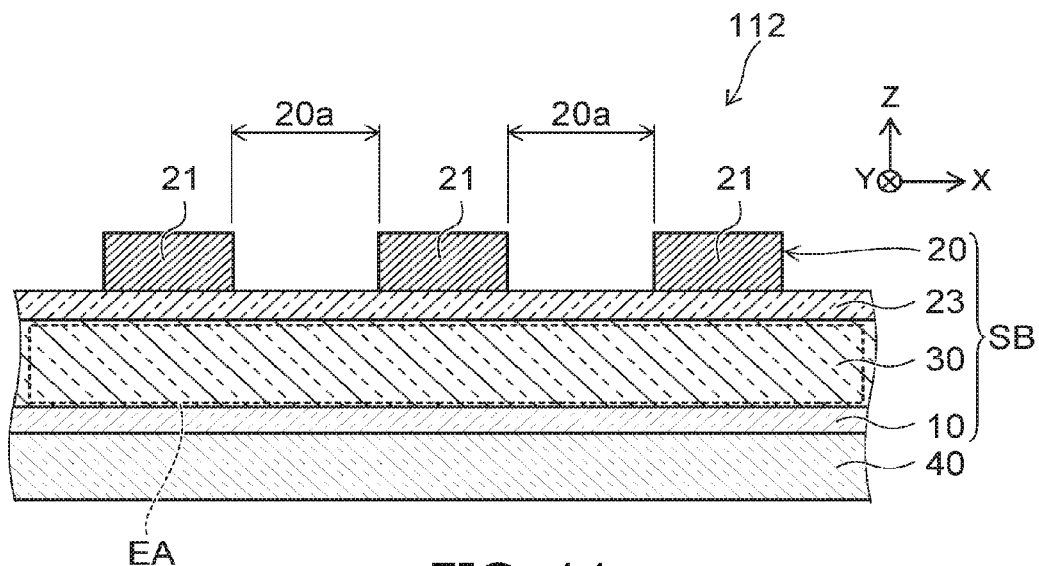
FIG. 11 is a cross-sectional view schematically showing another organic electroluminescent element according to the first embodiment.

FIG. 11 is a cross-sectional view schematically showing another organic electroluminescent element according to the first embodiment.

As shown in FIG. 11, the stacked body SB further includes a third electrode 23 in the organic electroluminescent element 112. The third electrode 23 is provided between the second electrode 20 and the organic layer 30. In other words, in the example, the third electrode 23 is provided on the organic layer 30; and the second electrode 20 is provided on the third electrode 23. The third electrode 23 is light-transmissive. The third electrode 23 is, for example, transparent. The third electrode 23 is electrically connected to the second electrode 20 and the organic layer 30. The third electrode 23 may include, for example, the material described in reference to the first electrode 10.

In the organic electroluminescent element 112, the entire organic layer 30 between the first electrode 10 and the third electrode 23 can be the light-emitting region EA. Therefore, in the organic electroluminescent element 112, the light that is emitted from the organic layer 30 is emitted also to the second electrode 20 side via the openings 20a of the second electrode 20. In other words, the organic electroluminescent element 112 can be a two-side emitting type. In the organic electroluminescent element 112, for example, the second electrode 20 functions as an auxiliary electrode of the third electrode 23.

Figure 12:
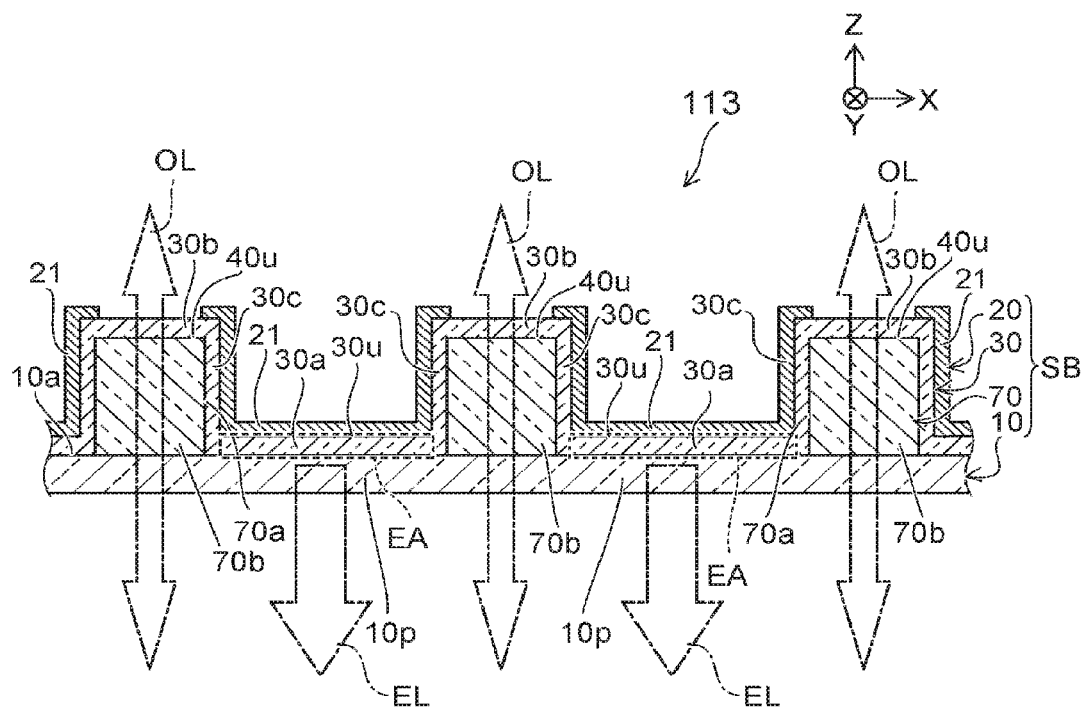
FIG. 12 is a cross-sectional view schematically showing another organic electroluminescent element according to the first embodiment.

FIG. 12 is a cross-sectional view schematically showing another organic electroluminescent element according to the first embodiment.

In the example as shown in FIG. 12, the organic electroluminescent element 113 includes an insulating layer 70.

The insulating layer 70 is provided on an upper surface 10a of the first electrode 10. The insulating layer 70 includes an insulating portion 70b and an opening 70a (a first opening). The insulating layer 70 includes, for example, the multiple openings 70a and the multiple insulating portions 70b. A portion of the first electrode 10 is exposed at each of the multiple openings 70a. In the example, multiple portions of the first electrode 10 are exposed at the multiple openings 70a. Hereinbelow, the portions of the first electrode 10 exposed at the openings 70a are called exposed portions 10p. The multiple insulating portions 70b are disposed between the multiple openings 70a. The insulating layer 70 is light-transmissive. The insulating layer 70 is, for example, transparent. For example, the insulating portions 70b have a stripe configuration.

The organic layer 30 is provided on the insulating layer 70. The organic layer 30 includes a first portion 30a provided on the exposed portion 10p of the first electrode 10, and a second portion 30b provided on the insulating layer 70. The second portion 30b is provided on at least a portion of the insulating layer 70.

The organic layer 30 further includes, for example, a third portion 30c between the first portion 30a and the second portion 30b. The third portion 30c is the portion along the side surface of the insulating portion 70b linking the first portion 30a to the second portion 30b. In the example, the organic layer 30 includes the multiple first portions 30a provided on the multiple exposed portions 10p, the multiple second portions 30b provided on the multiple insulating portions 70b, and the multiple third portions 30c between the multiple first portions 30a and the multiple second portions 30b. For example, the organic layer 30 is provided to be continuous on each of the multiple insulating portions 70b and on each of the multiple exposed portions 10p. For example, the organic layer 30 is provided on at least a portion of each of the multiple insulating portions 70b and on each of the multiple exposed portions 10p.

The thickness (the length along the Z-axis direction) of the organic layer 30 is thinner than the thickness of the insulating layer 70 (the insulating portion 70b). The distance in the Z-axis direction between an upper surface 30u of the first portion 30a of the organic layer 30 and the upper surface 10a of the first electrode 10 is shorter than the distance in the Z-axis direction between an upper surface 70u of the insulating portion 70b of the insulating layer 70 and the upper surface 10a of the first electrode 10. In other words, the upper surface 30u of the first portion 30a is positioned lower than the upper surface 70u of the insulating portion 70b.

The second electrode 20 is provided on the organic layer 30. The first conductive portions 21 and the second conductive portions 22 of the second electrode 20 are provided to connect the openings 70a of the insulating layer 70. For example, in the case where the insulating portions 70b have the stripe configuration, the first conductive portion 21 is provided between two mutually-adjacent insulating portions 70b. Also, the second conductive portion 22 is provided to intersect the insulating portions 70b having the stripe configuration.

When the image of the background is visually confirmed in the organic electroluminescent element 113, it is desirable for the configuration of the second electrode 20 to be fine enough not to be recognized by the viewer. Accordingly, to form the second electrode 20 to be as fine as possible, the second electrode 20 is formed by disposing the mask 50 to be as proximal to the foundation layer as possible when forming the second electrode 20. In the embodiment, the foundation layer is the organic layer 30. As in FIG. 12, the insulating layer 70 is provided to have a height from the first electrode 10 that is higher than that of the organic layer 30. When forming the second electrode 20, the mask 50 is disposed to contact the insulating layer 70. Thereby, undesirable scratching of the light-emitting region EA due to the mask 50 contacting the portion of the organic layer 30 used to form the light-emitting region EA can be suppressed. For example, the formation precision of the second electrode 20 can be increased further.

Figure 13:
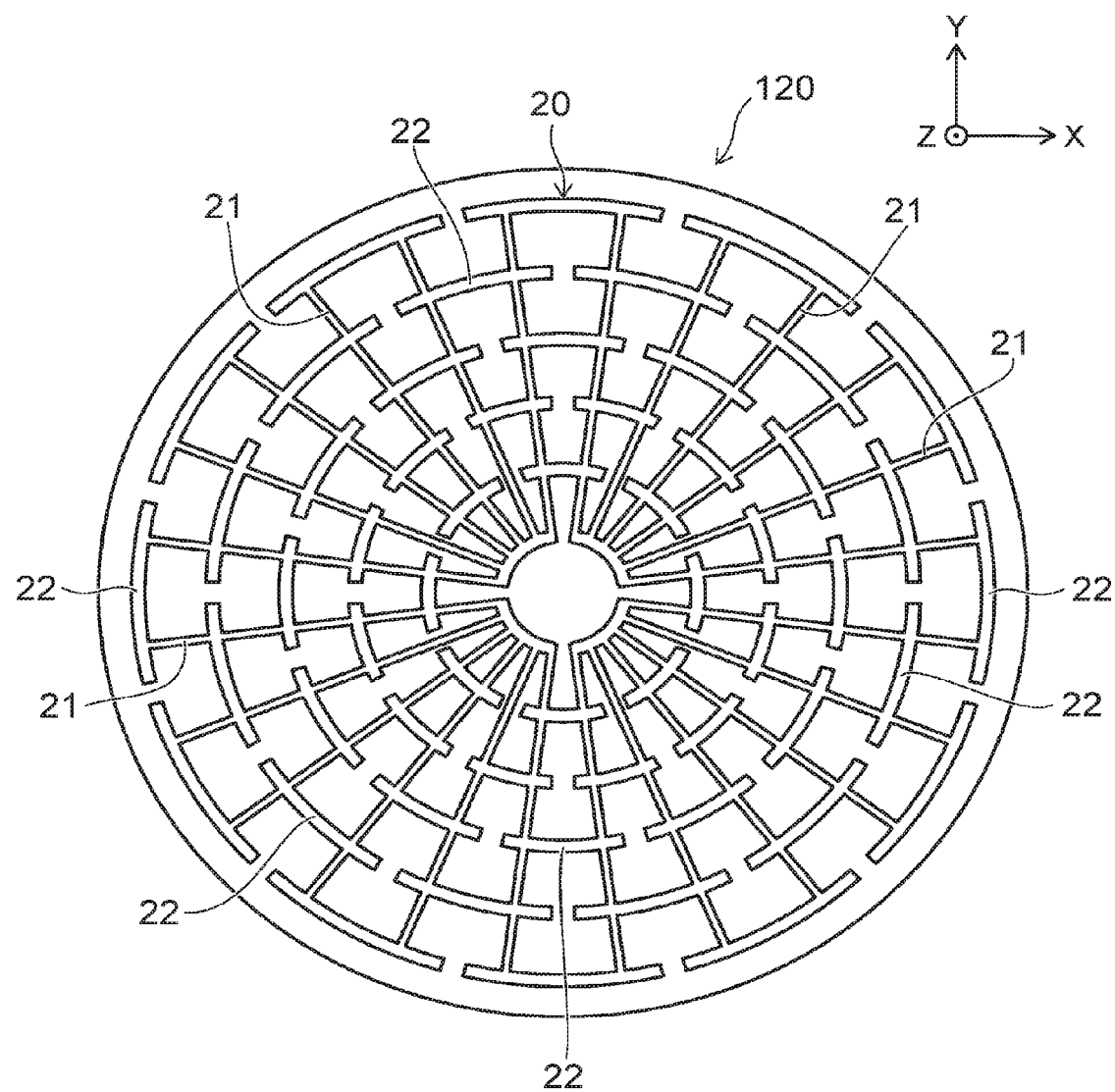
FIG. 13 is a plan view schematically showing another organic electroluminescent element according to the first embodiment.

FIG. 13 is a plan view schematically showing another organic electroluminescent element according to the first embodiment.

As shown in FIG. 13, the configuration of the organic electroluminescent element 120 projected onto the X-Y plane is substantially a circle.

In the organic electroluminescent element 120, the multiple first conductive portions 21 extend in a radial direction and are arranged in a circumferential direction intersecting the radial direction. Also, the multiple second conductive portions 22 extend in the circumferential direction and are arranged in the radial direction. In other words, in the example, the first direction is the radial direction; and the second direction is the circumferential direction.

Thus, in the organic electroluminescent element 120 having the substantially circular configuration, the first direction may be the radial direction; and the second direction may be the circumferential direction. In the organic electroluminescent element 120, the length in the radial direction of the first conductive portion 21 is set to be longer than 1 mm and not more than 47 mm. The length in the circumferential direction of the second conductive portion 22 is set to be longer than 1 mm and not more than 47 mm. Thereby, similarly to the embodiments recited above, the light emission characteristics of the organic electroluminescent element 120 can be improved. In the organic electroluminescent element having the circular configuration, for example, the second electrode 20 having the mesh configuration including the first conductive portions 21 extending in the Y-axis direction and the second conductive portions 22 extending in the X-axis direction may be used. In the case of the organic electroluminescent element having the circular configuration, the first direction may not necessarily be the radial direction. The second direction may not necessarily be the circumferential direction.

The organic electroluminescent element may have a rectangular configuration, another polygonal configuration, a circular configuration, an elliptical configuration, etc. The configuration of the organic electroluminescent element may be any configuration.

Figure 14:
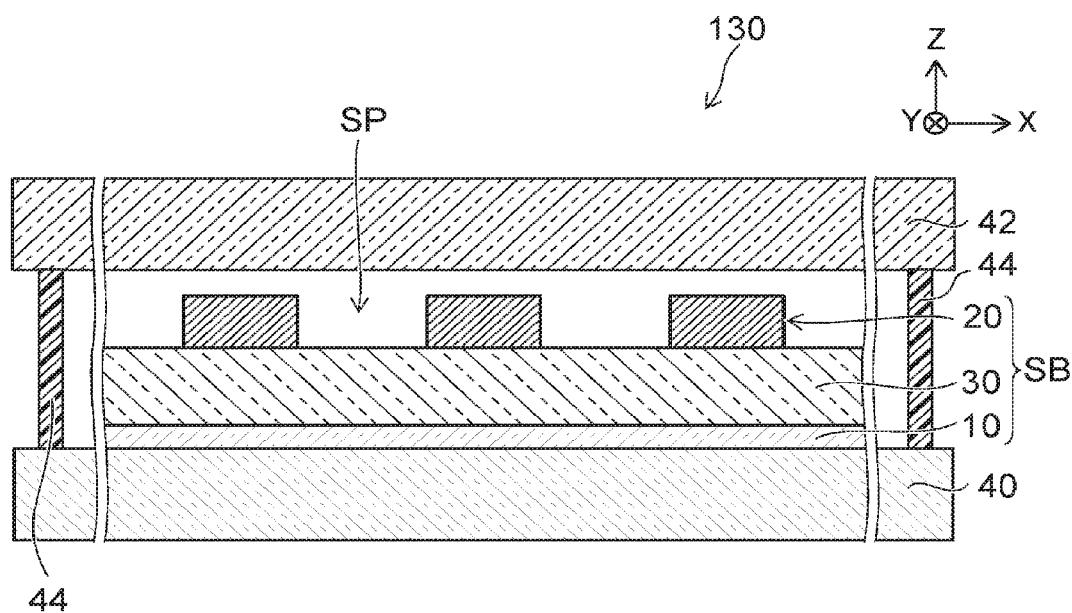
FIG. 14 is a cross-sectional view schematically showing another organic electroluminescent element according to the first embodiment.

FIG. 14 is a cross-sectional view schematically showing another organic electroluminescent element according to the first embodiment.

As shown in FIG. 14, the organic electroluminescent element 130 further includes a substrate 42 and a sealing unit 44.

The substrate 42 is light-transmissive. The substrate 42 is, for example, transparent. The substrate 42 may include, for example, the material described in reference to the substrate 40. The substrate 42 is provided on the stacked body SB. In other words, the substrate 42 is provided on the second electrode 20.

In the example, the stacked body SB is the same as the stacked body SB described in reference to the organic electroluminescent element 110. The stacked body SB may be the stacked bodies SB described in reference to the organic electroluminescent elements 111 and 112.

For example, the sealing unit 44 is provided in an annular configuration along the outer edges of the substrates 40 and 42 and bonds the substrates 40 and 42. The sealing unit 44 surrounds the first electrode 10, the second electrode 20, and the organic layer 30. In other words, the sealing unit 44 surrounds the stacked body SB. Thereby, the stacked body SB is sealed by the substrates 40 and 42 and the sealing unit 44. Thus, by sealing the stacked body SB, for example, the penetration of moisture into the organic layer 30 can be suppressed.

In the organic electroluminescent element 130, the distance in the Z-axis direction between the substrates 40 and 42 is regulated by the sealing unit 44. For example, this configuration can be realized by including a spacer having a granular configuration (not shown) in the sealing unit 44. For example, multiple spacers having granular configurations are dispersed in the sealing unit 44; and the distance between the substrates 40 and 42 is regulated by the diameters of the multiple spacers.

In the organic electroluminescent element 130, the thickness (the length along the Z-axis direction) of the sealing unit 44 is, for example, not less than 1 μm and not more than 100 μm. More favorably, the thickness is, for example, not less than 5 μm and not more than 20 μm. Thereby, for example, the penetration of the moisture, etc., can be suppressed. For example, the thickness of the sealing unit 44 is substantially the same as the diameters of the spacers dispersed in the sealing unit 44.

For example, an intermediate layer that includes a hygroscopic material may be filled into a space SP surrounded with the substrates 40 and 42 and the sealing unit 44. For example, the intermediate layer also may be oxygen-adsorptive. The hygroscopic material includes, for example, calcium oxide, silica, zeolite, barium oxide, etc. For example, the hygroscopic material is dispersed in the resin material. The resin material includes, for example, an acrylic resin, a triazine resin, a silicone resin, an epoxy resin, etc. Thus, the intermediate layer includes a resin material. Thereby, for example, when bonding the substrates 40 and 42, the substrate 42 contacts the stacked body SB; and the undesirable scratching of the stacked body SB can be suppressed.

Thus, the space SP is filled with the intermediate layer including the hygroscopic material. Thereby, the penetration of the moisture into the organic layer 30 can be suppressed more appropriately. The intermediate layer is provided as necessary and is omissible. The space SP may be, for example, an air layer. For example, an inert gas such as $N_2$, Ar, etc., may be filled into the space SP. The intermediate layer may not include the hygroscopic material. The intermediate layer may include, for example, the resin material recited above that does not include the hygroscopic material.

It is favorable for the second electrode 20 to satisfy the following conditions so that the image of the background can be visually confirmed but the configuration of the second electrode 20 is not recognized easily by the viewer. Namely, a length Lx1 in the X-axis direction of the first conductive portion 21 is set to W1 (micrometers). The first conductive portions 21 are arranged at uniform spacing at a pitch P1 (micrometers). A length Ly2 in the Y-axis direction of the second conductive portion 22 is set to W2 (micrometers). The second conductive portions 22 are arranged at uniform spacing at a pitch P2 (micrometers). W1 and P1 satisfy the relationship of $W1 \leq -750(1-W1/P1)(1-W2/P2)+675$. W2 and P2 satisfy the relationship of $W2 \leq -750(1-W1/P1)(1-W2/P2)+675$.

By the second electrode 20 satisfying such conditions, the problem of the blurring of the image of the background due to the diffraction phenomenon of the light occurring due to the openings surrounded with the first conductive portions 21 and the second conductive portions 22 does not occur easily; and the image of the background is visually confirmed easily. When the organic electroluminescent element is unlit as well, the second electrode 20 is not recognized easily by the viewer; and an organic electroluminescent element having excellent light transmissivity can be obtained.

Second Embodiment

Figure 15:
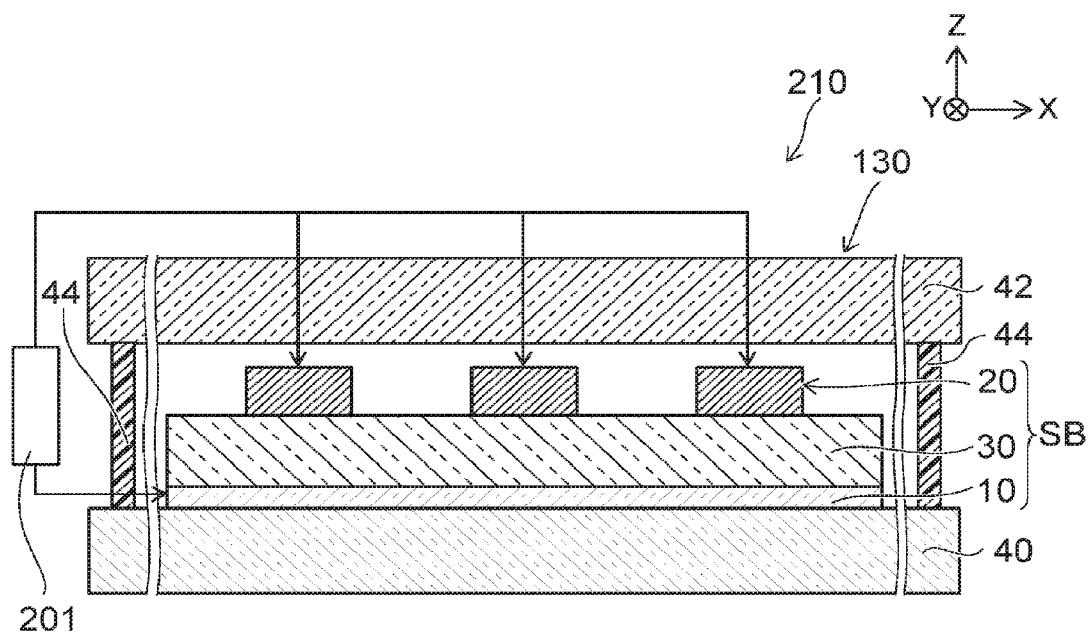
FIG. 15 is a schematic view showing a lighting device according to a second embodiment.

FIG. 15 is a schematic view showing a lighting device according to a second embodiment.

As shown in FIG. 15, the lighting device 210 according to the embodiment includes the organic electroluminescent element according to the first embodiment (e.g., the organic electroluminescent element 130) and a power supply unit 201.

The power supply unit 201 is electrically connected to the first electrode 10 and the second electrode 20. The power supply unit 201 supplies a current to the organic layer 30 via the first electrode 10 and the second electrode 20. Thereby, light is emitted from the organic electroluminescent element 130 (the organic layer 30) due to the supply of the current from the power supply unit 201.

According to the lighting device 210 according to the embodiment, a lighting device having good light emission characteristics can be provided.

Third Embodiment

Figure 16A:
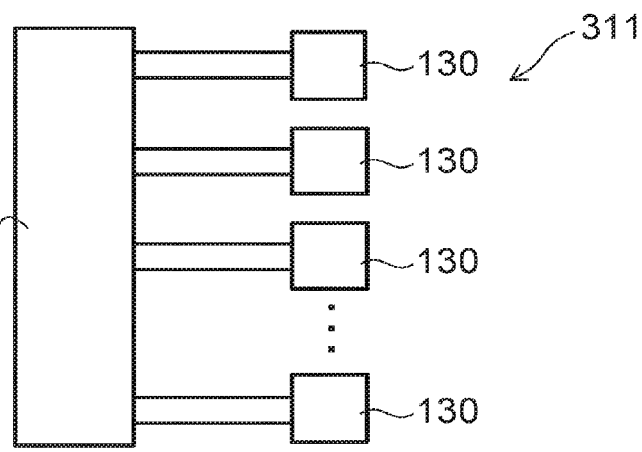
FIG. 16A to FIG. 16C are schematic views showing lighting systems according to a third embodiment.
Figure 16B:
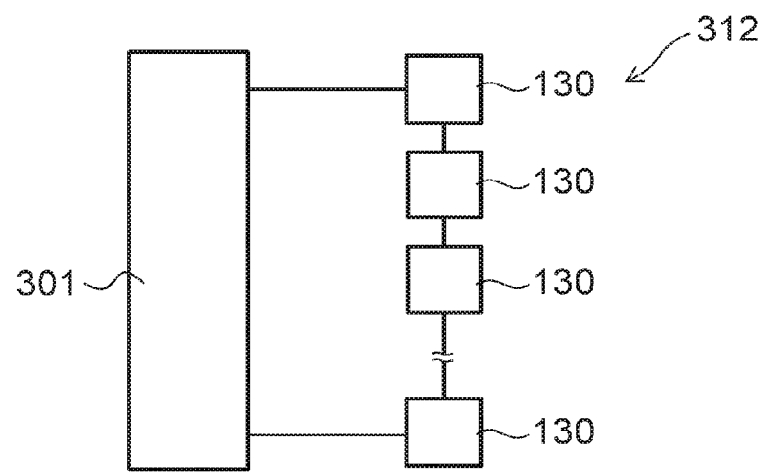
Figure 16C:
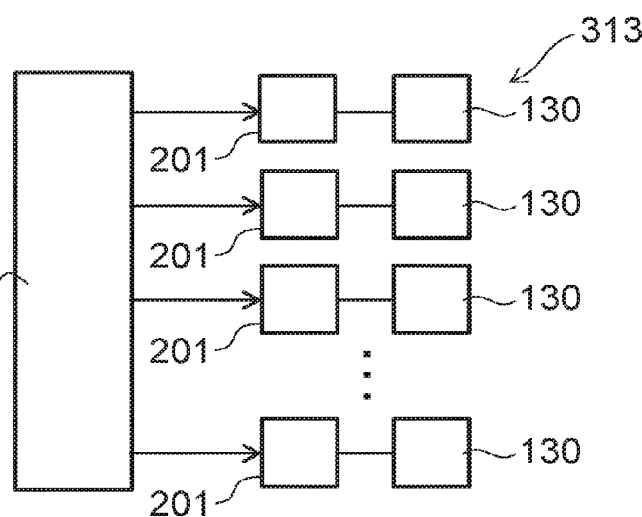

FIG. 16A to FIG. 16C are schematic views showing lighting systems according to a third embodiment.

As shown in FIG. 16A, a lighting system 311 according to the embodiment includes multiple organic electroluminescent elements according to the first embodiment (e.g., the organic electroluminescent element 130) and a controller 301.

The controller 301 is electrically connected to each of the multiple organic electroluminescent elements 130 and controls the lit state/unlit state of each of the multiple organic electroluminescent elements 130. For example, the controller 301 is electrically connected to the first electrode 10 and the second electrode 20 of each of the multiple organic electroluminescent elements 130. Thereby, the controller 301 individually controls the lit state/unlit state of each of the multiple organic electroluminescent elements 130.

In a lighting system 312 as shown in FIG. 16B, the multiple organic electroluminescent elements 130 are connected in series. The controller 301 is electrically connected to the first electrode 10 of one organic electroluminescent element 130 of the multiple organic electroluminescent elements 130. The controller 301 also is electrically connected to the second electrode 20 of one other organic electroluminescent element 130 of the multiple organic electroluminescent elements 130. Thereby, the controller 301 collectively controls the lit state/unlit state of each of the multiple organic electroluminescent elements 130. Thus, the controller 301 may control the lit state/unlit state of each of the multiple organic electroluminescent elements 130 individually or collectively.

As shown in FIG. 16C, a lighting system 313 further includes the power supply unit 201. In the example, the lighting system 313 includes the multiple power supply units 201. The multiple power supply units 201 are electrically connected respectively to the multiple organic electroluminescent elements 130.

In the lighting system 313, the controller 301 is electrically connected to each of the multiple power supply units 201. In other words, in the lighting system 313, the controller 301 is electrically connected to each of the multiple organic electroluminescent elements 130 via the multiple power supply units 201. For example, the controller 301 inputs a control signal to each of the power supply units 201. Each of the power supply units 201 supplies a current to the organic electroluminescent element 130 according to the control signal from the controller 301 and causes the organic electroluminescent element 130 to turn on.

Thus, the controller 301 may control the lit state/unlit state of the multiple organic electroluminescent elements 130 via the power supply units 201. In the example, the multiple power supply units 201 are connected respectively to the multiple organic electroluminescent elements 130. This is not limited thereto; for example, one power supply unit 201 may be connected to the multiple organic electroluminescent elements 130. For example, the one power supply unit 201 may be able to supply currents selectively to the multiple organic electroluminescent elements 130 according to control signals from the controller 301. The electrical connection between the controller 301 and the power supply units 201 may be wired or wireless. For example, the control signals from the controller 301 may be input to the power supply units 201 by wireless communication.

According to the lighting systems 311 to 313 according to the embodiment, a lighting system having good light emission characteristics can be provided.

According to the embodiments, an organic electroluminescent element, a lighting device, a lighting system, and a method for manufacturing the organic electroluminescent element that have good light emission characteristics can be provided.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel. In the specification of the application, a state of "provided on" includes a state to be provided having another element being inserted therebetween in addition to a state to be provided directly contacting. A state of "stacking" includes a state to be stacked having another element inserted therebetween in addition to a state to be provided directly contacting each other. A state of "electrically connected" includes a state to be connected through another electrical member in addition to a state to be connected directly contacting.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in organic electroluminescent elements such as first electrode, second electrode, organic layer, first conductive portion, second conductive portion, substrate, and power supply unit included in lighting devices, and controller included in lighting systems, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all organic electroluminescent elements, lighting devices, lighting systems, and methods for manufacturing the organic electroluminescent element practicable by an appropriate design modification by one skilled in the art based on the organic electroluminescent elements, the lighting devices, the lighting systems, and the method for manufacturing the organic electroluminescent element described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An organic electroluminescent element, comprising:
 a first electrode being light-transmissive;
 an organic layer provided on the first electrode; and
 a second electrode provided on the organic layer, the second electrode being light-reflective and including a first conductive portion and a second conductive portion, the first conductive portion extending in a first direction, the second conductive portion extending in a second direction intersecting the first direction, the second conductive portion intersecting the first conductive portion, a length in the first direction of the first conductive portion being longer than 1 mm and not more than 47 mm, a length in the second direction of the second conductive portion being longer than 1 mm and not more than 47 mm.

2. The element according to claim 1, wherein the second electrode includes a plurality of the first conductive portions and a plurality of the second conductive portions, the plurality of first conductive portions being arranged in the second direction, the plurality of second conductive portions being arranged in the first direction.

3. The element according to claim 2, wherein
 the length in the first direction of each of the plurality of first conductive portions is not less than twice a spacing in the first direction of the plurality of second conductive portions, and
 the length in the second direction of each of the plurality of second conductive portions is not less than twice a spacing in the second direction of the plurality of first conductive portions.

4. The element according to claim 2, wherein
 the plurality of first conductive portions is arranged in the second direction and arranged in the first direction, and
 the plurality of second conductive portions is arranged in the first direction and arranged in the second direction.

5. The element according to claim 2, wherein
 a position of an end portion in the first direction of one first conductive portion of the plurality of first conductive portions is different from a position of an end portion in the first direction of one other first conductive portion adjacent to the one first conductive portion, and a position of an end portion in the second direction of one second conductive portion of the plurality of second conductive portions is different from a position of an end portion in the second direction of one other second conductive portion adjacent to the one second conductive portion.

6. The element according to claim 1, wherein
the first direction is a radial direction, and
the second direction is a circumferential direction.

7. A lighting device, comprising:
an organic electroluminescent element; and
a power supply unit,
the organic electroluminescent element including
a first electrode, the first electrode being light-transmissive,
an organic layer provided on the first electrode, and
a second electrode provided on the organic layer, the second electrode being light-reflective and including a first conductive portion and a second conductive portion, the first conductive portion extending in a first direction, the second conductive portion extending in a second direction intersecting the first direction, the second conductive portion intersecting the first conductive portion, a length in the first direction of the first conductive portion being longer than 1 mm and not more than 47 mm, a length in the second direction of the second conductive portion being longer than 1 mm and not more than 47 mm,
the power supply unit being electrically connected to the first electrode and the second electrode and supplying a current to the organic layer via the first electrode and the second electrode.

8. A lighting system, comprising:
a plurality of organic electroluminescent elements; and
a controller electrically connected to each of the plurality of organic electroluminescent elements, the controller controlling a lit state and an unlit state of each of the plurality of organic electroluminescent elements,
each of the plurality of organic electroluminescent elements including
a first electrode, the first electrode being light-transmissive,
an organic layer provided on the first electrode, and
a second electrode provided on the organic layer, the second electrode being light-reflective and including a first conductive portion and a second conductive portion, the first conductive portion extending in a first direction, the second conductive portion extending in a second direction intersecting the first direction, the second conductive portion intersecting the first conductive portion, a length in the first direction of the first conductive portion being longer than 1 mm and not more than 47 mm, a length in the second direction of the second conductive portion being longer than 1 mm and not more than 47 mm.

9. A method for manufacturing an organic electroluminescent element, comprising:
forming a first electrode on a substrate, the first electrode being light-transmissive;
forming an organic layer on the first electrode; and
forming a second electrode on the organic layer, the second electrode being light-reflective, the forming of the second electrode causing the second electrode to include a first conductive portion and a second conductive portion by using a mask including a slit portion, the first conductive portion extending in a first direction, the second conductive portion extending in a second direction intersecting the first direction, the second conductive portion intersecting the first conductive portion, a length in the first direction of the first conductive portion being longer than 1 mm and not more than 47 mm, a length in the second direction of the second conductive portion being longer than 1 mm and not more than 47 mm.

* * * * *